United States Patent
Tran

(10) Patent No.: US 8,450,840 B1
(45) Date of Patent: May 28, 2013

(54) ULTRA RUGGEDIZED BALL GRID ARRAY ELECTRONIC COMPONENTS

(75) Inventor: Thanh Tran, Temple City, CA (US)

(73) Assignee: TeleCommunication Systems, Inc., Annapolis, MD (US)

(*) Notice: Subject to any disclaimer, the term of this patent is extended or adjusted under 35 U.S.C. 154(b) by 0 days.

(21) Appl. No.: 12/930,105

(22) Filed: Dec. 27, 2010

(51) Int. Cl.
*H01L 23/48* (2006.01)

(52) U.S. Cl.
USPC ........... 257/693; 257/737; 257/787; 257/792; 257/E23.069; 257/E23.116; 257/E23.129; 257/E21.502

(58) Field of Classification Search
USPC ........... 257/659, 660, 678–734, 737, 738, 257/753, 773, 778, 781, 783, 792, E23.069, 257/E23.116, E23.129, E21.502
See application file for complete search history.

(56) References Cited

U.S. PATENT DOCUMENTS

| | | | |
|---|---|---|---|
| 3,971,127 A | 7/1976 | Giguere | |
| 5,121,297 A | 6/1992 | Haas | |
| 5,224,023 A | 6/1993 | Smith | |
| 5,355,016 A * | 10/1994 | Swirbel et al. | 257/659 |
| 5,428,190 A | 6/1995 | Stopperan | |
| 5,430,607 A | 7/1995 | Smith | |
| 5,623,191 A | 4/1997 | Wieloch | |
| 5,754,409 A | 5/1998 | Smith | |
| 5,764,497 A | 6/1998 | Mizumo | |
| 6,365,978 B1 * | 4/2002 | Ibnabdeljalil et al. | 257/786 |
| 6,433,409 B2 * | 8/2002 | Mita et al. | 257/673 |
| 6,469,255 B2 | 10/2002 | Watanabe | |
| 7,719,828 B2 | 5/2010 | Brown | |
| 7,898,074 B2 * | 3/2011 | Eckhardt et al. | 257/690 |
| 8,080,880 B2 * | 12/2011 | Brunnbauer et al. | 257/773 |
| 8,190,169 B2 | 5/2012 | Shim | |
| 2005/0057849 A1 | 3/2005 | Twogood | |
| 2008/0026723 A1 | 1/2008 | Han | |
| 2009/0058830 A1 | 3/2009 | Herz | |

* cited by examiner

*Primary Examiner* — Jasmine Clark

(74) *Attorney, Agent, or Firm* — William H. Bollman

(57) ABSTRACT

Parylene-coated, ultra ruggedized ball grid array electronic components include a substrate with electronic components attached to one surface, and solder balls attached to a second substrate surface through openings formed in the parylene coating.

2 Claims, 2 Drawing Sheets

STEP 18

STEP 19

STEP 20

STEP 21

ULTRA RUGGEDIZED BALL GRID ARRAY ELECTRONIC COMPONENTS

This invention comprises ultra ruggedized ball grid array electronic components that are resistant to degradation from humidity and from pressure. These components are externally coated with parylene, and include openings through the parylene coating at their base to receive solder balls. Parylene is a tradename for a plurality of chemical vapor deposited poly(pxylylene) polymers, such as the polymers called parylene C, parylene N, parylene AF-4 parylene SF, parylene D, parylene A, parylene AM, parylene CF, and parylene HT.

In some embodiments, these components may include a substrate, with one or more dies and wirebonds mounted on the substrate. Molding material may cover the dies and wirebonds to hold them in place on the substrate, and to insulate them from the environment. Making these embodiments includes the steps of: coating the ball grid array with parylene; laser ablating a surface of the array to form openings to receive solder balls; and placing solder balls in each of the openings so formed. Preferably, the solder openings are smaller than the solder balls to facilitate formation of a seal after the solder is melted.

BRIEF DESCRIPTION OF THE DRAWINGS

The drawings illustrate an example, or embodiment, of an ultra ruggedized ball grid array electronic component, and include.

DETAILED DESCRIPTION OF THE DRAWINGS

Figure 1:
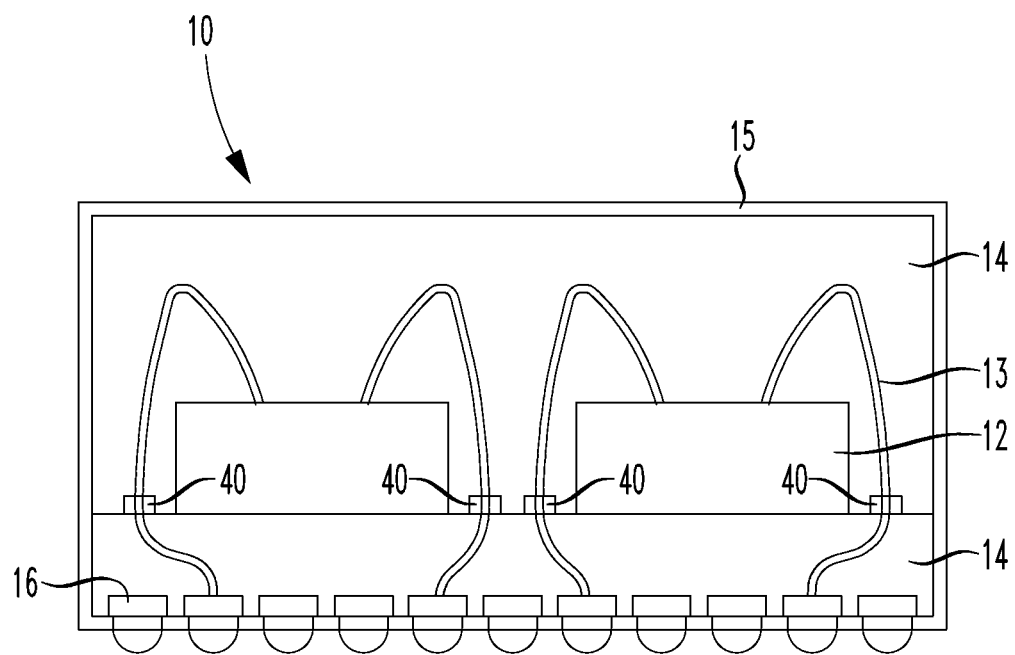
FIGS. 1 and 2 show a side elevation view of this array.
Figure 2:
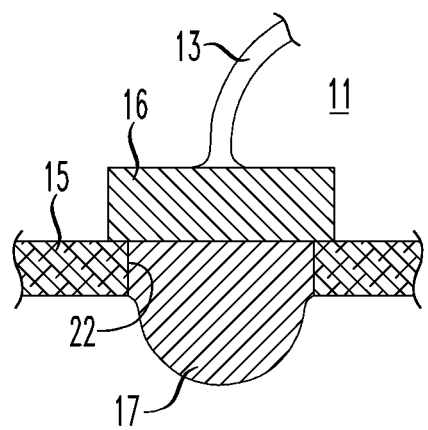
Figure 3A:
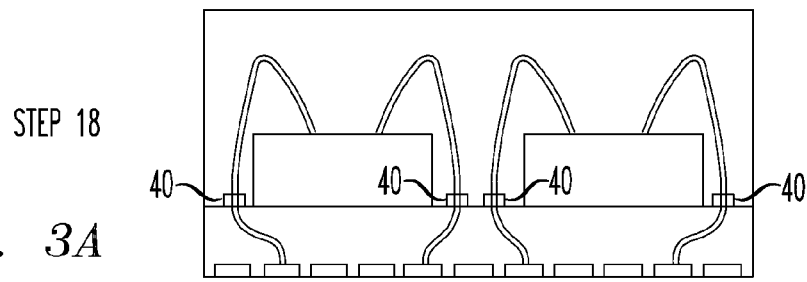
FIGS. 3A to 3D show manufacture of the array of FIG. 1.
Figure 3B:
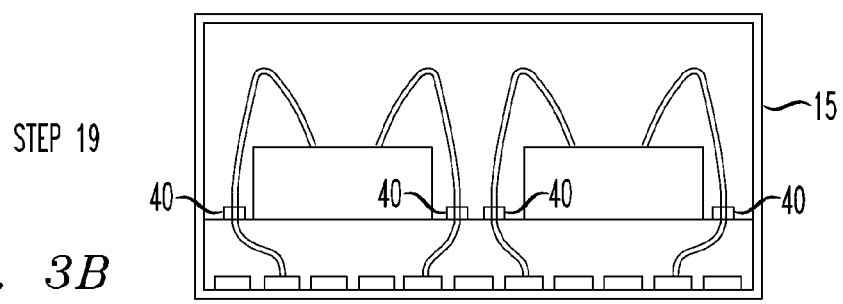
Figure 3C:
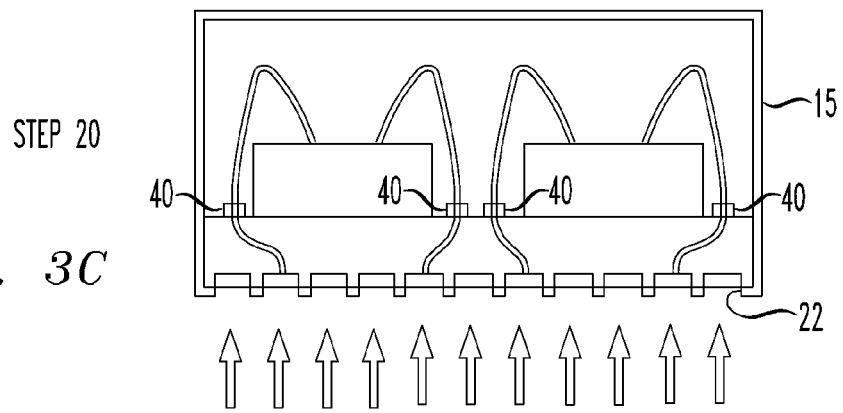
Figure 3D:
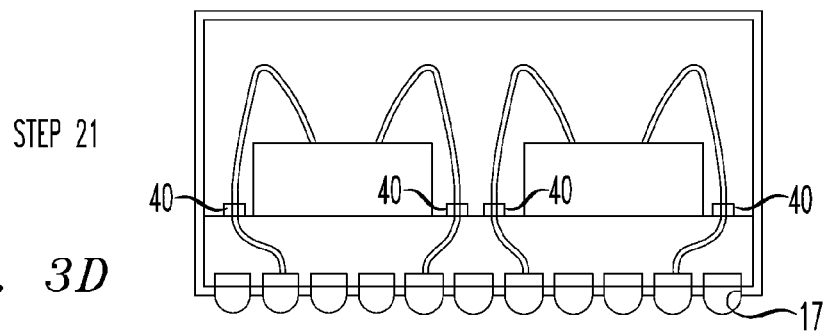

FIGS. 1 and 2 show a side elevation view in cross-section of an exemplary array 10. This array 10 includes substrate 11 with dies 12 and wirebonds 13 mounted on substrate 11. Molding 14 covers dies 12 and wirebonds 13, holding them in place on substrate 11, and insulating them from the environment. A parylene coating 15 covers the entire external surface of array 10, except for the openings 16 in which are solder balls 17. Wirebond pads 40 affix wirebonds 13 to solder balls 17.

FIGS. 3A to 3D show the manufacture of array 10. At step 18 shown in FIG. 3A, uncoated array is passed to step 19 shown in FIG. 3B, where a parylene coating 15 is applied to the entire external surface of the array. At the next step 20 shown in FIG. 3C, solder pad openings 22 are formed in the parylene coating 15 on the substrate 11 via laser ablation. Each opening 22 is smaller in length than the diameter of the solder ball 17 so that the solder, after melting, seals the corresponding opening 22. At the next step 21 shown in FIG. 3D, solder balls 17 are placed in openings 22.

The above-described embodiment of this invention is exemplary, and is not meant to limit the scope of the claims.

What is claimed is:

1. A parylene-coated, ultra ruggedized ball grid array electronic component, comprising:
   a rectangular block substrate to attach dies and wirebonds to one surface thereof; and
   at least one solder ball to attach to a second surface of said substrate opposite said one surface, through at least one opening in a parylene coating that is smaller than a diameter of said at least one solder ball;
   wherein said at least one solder ball seals said at least one opening in said parylene coating.

2. A parylene-coated, ultra ruggedized ball grid array electronic components, comprising:
   a rectangular block substrate to attach dies and wirebonds to one surface thereof; and
   at least one solder ball melted and sealed to a second surface of said substrate opposite said one surface, through at least one opening in said parylene coating;
   wherein said at least one solder ball seals said at least one opening in said parylene coating.

\* \* \* \* \*